United States Patent
Boni et al.

(10) Patent No.: US 12,292,567 B2
(45) Date of Patent: May 6, 2025

(54) MICROELECTROMECHANICAL MIRROR DEVICE WITH COMPENSATION OF PLANARITY ERRORS

(71) Applicant: STMicroelectronics S.r.l., Agrate Brianza (IT)

(72) Inventors: Nicolo' Boni, Albino (IT); Roberto Carminati, Piancogno (IT); Massimiliano Merli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 811 days.

(21) Appl. No.: 17/465,329

(22) Filed: Sep. 2, 2021

(65) Prior Publication Data

US 2022/0099959 A1    Mar. 31, 2022

(30) Foreign Application Priority Data

Sep. 30, 2020   (IT) .................. 102020000023110

(51) Int. Cl.
*G02B 26/08* (2006.01)
*B81B 3/00* (2006.01)
*G02B 26/10* (2006.01)

(52) U.S. Cl.
CPC ........ *G02B 26/0858* (2013.01); *B81B 3/0021* (2013.01); *G02B 26/105* (2013.01); *B81B 2201/042* (2013.01)

(58) Field of Classification Search
CPC .......................... G02B 26/0858; G02B 26/105; B81B 3/0021; B81B 2201/042
See application file for complete search history.

(56) References Cited

U.S. PATENT DOCUMENTS

| | | |
|---|---|---|
| 2012/0170134 A1 | 7/2012 | Bolis et al. |
| 2013/0278984 A1 | 10/2013 | Honda et al. |
| 2018/0180871 A1* | 6/2018 | Costantini .......... G02B 26/0833 |
| 2019/0196176 A1* | 6/2019 | Yamada .............. G02B 26/101 |
| 2020/0192199 A1 | 6/2020 | Boni et al. |

FOREIGN PATENT DOCUMENTS

| | | |
|---|---|---|
| CN | 108535860 A | 9/2018 |
| CN | 217639747 U | 10/2022 |
| JP | 2011017916 A | 1/2011 |
| JP | 2017156453 A | 9/2017 |
| WO | 2006119792 A1 | 11/2006 |

OTHER PUBLICATIONS

IT Search Report and Written Opinion for IT Appl. No. 102020000023110 dated May 21, 2021 (9 pages).
Chinese First Office Action and Search Report for counterpart CN Appl. No. 202111151326.0, report dated Oct. 12, 2024, 9 pgs.

* cited by examiner

*Primary Examiner* — Euncha P Cherry
(74) *Attorney, Agent, or Firm* — Crowe & Dunlevy LLC

(57) ABSTRACT

A microelectromechanical mirror device includes a supporting frame of semiconductor material and a plate of semiconductor material. The plate is connected to the supporting frame so as to be orientable around at least one rotation axis. A reflective layer is arranged on a first region of the plate. A piezoelectric actuation structure extends on a second region of the plate adjacent to the reflective layer. The piezoelectric actuation structure is configured to apply forces such as to modify a curvature of the plate.

38 Claims, 4 Drawing Sheets

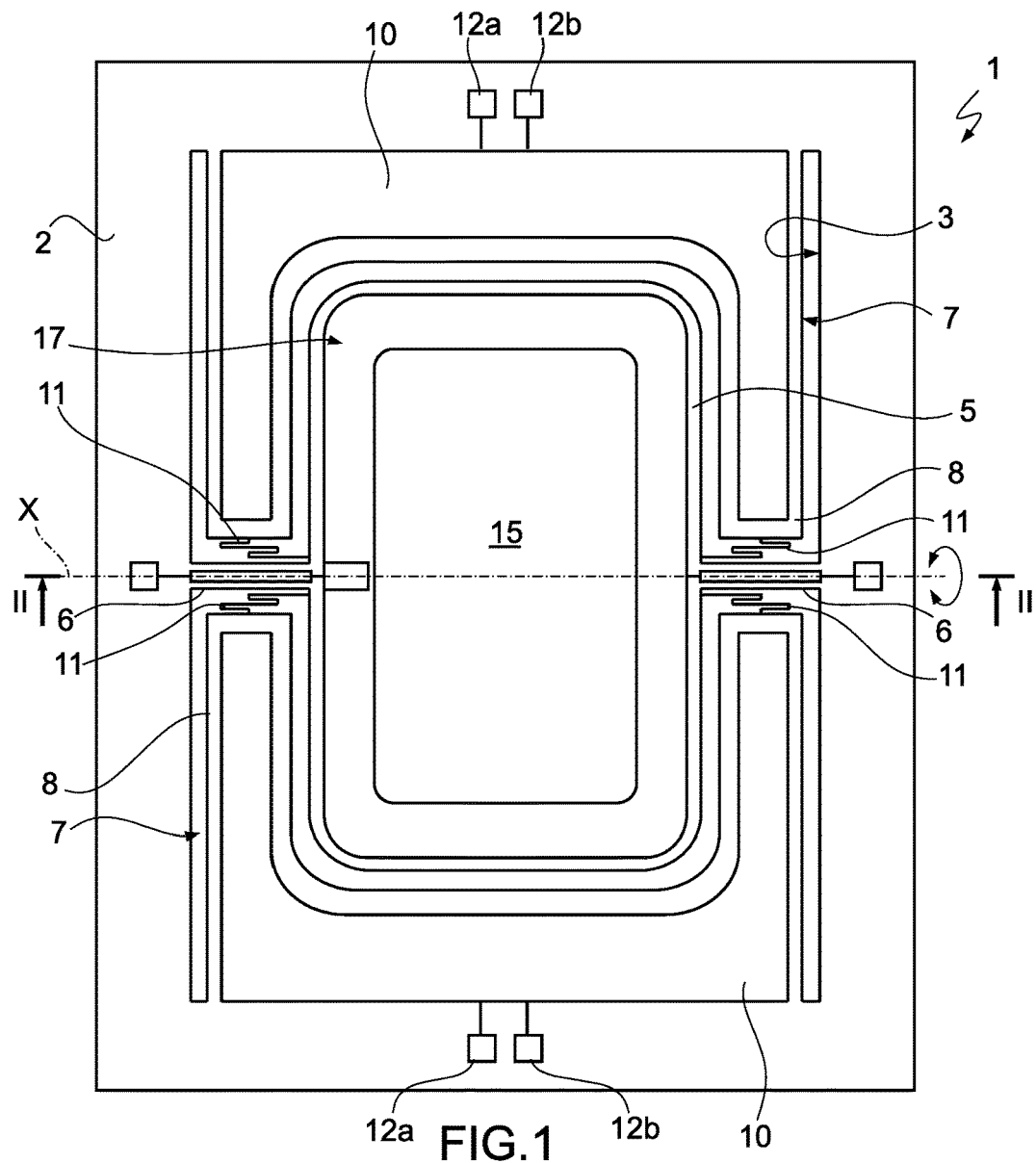
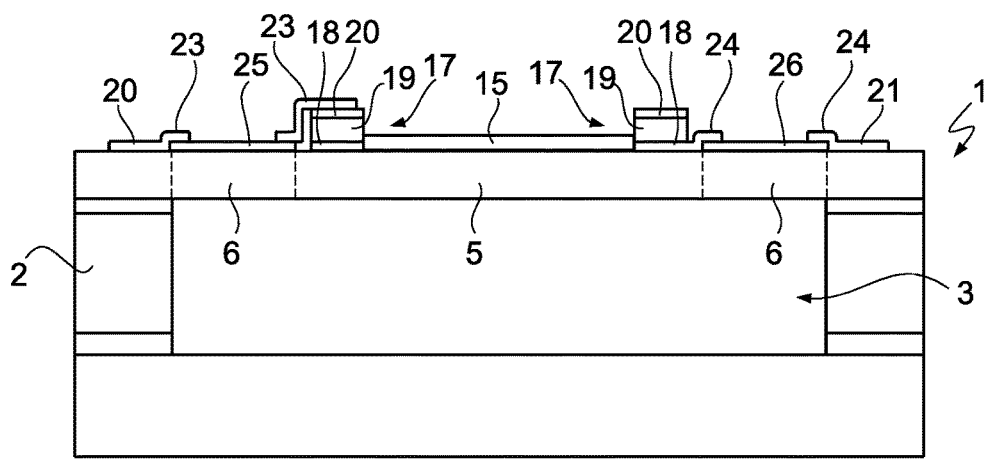
FIG.1
FIG.2

MICROELECTROMECHANICAL MIRROR DEVICE WITH COMPENSATION OF PLANARITY ERRORS

PRIORITY CLAIM

This application claims the priority benefit of Italian Application for Patent No. 102020000023110, filed on Sep. 30, 2020, the content of which is hereby incorporated by reference in its entirety to the maximum extent allowable by law.

TECHNICAL FIELD

This disclosure relates to a microelectromechanical mirror device made using MEMS (Micro-Electro-Mechanical System) technology, with compensation for planarity errors.

BACKGROUND

MEMS mirror devices are used in portable apparatuses, such as for example smartphones, tablets, notebooks, PDAs, for optical applications. In particular, MEMS mirror devices in such portable apparatuses are used to direct light radiation beams generated by a light source in desired manners, for example for projecting images from a distance. Due to their small size, these devices allow stringent requirements as to space occupation, in terms of area and thickness, to be complied with.

For example, MEMS mirror devices are used in miniaturized projectors (so-called "picoprojectors"), capable of projecting images from a distance and generating desired light patterns.

MEMS mirror devices generally include a mirror structure elastically supported on a cavity and formed from a body of semiconductor material so as to be movable, for example with tilt or rotation movement outside a relative main extension plane, to direct an incident light beam in a desired manner.

Typically, a deflection of the light beam along two axes is desired, which may be achieved through the use of two MEMS mirror devices of a uniaxial type, or through the use of a single MEMS mirror device of a biaxial type. The rotation of the mirror device is controlled by an actuation system which may be of a piezoelectric type, due to the advantages offered by piezoelectric actuation systems as compared to to electrostatic and electromagnetic actuation systems in terms of operating voltages and power consumption.

The mirror structure generally comprises a thin plate of semiconductor material connected, through elastic elements, to a supporting frame and to the actuation system so as to be capable of oscillating around the desired rotation axes. A reflective layer, for example of aluminum or gold, is arranged on the plate and forms the mirror.

A common problem in known mirror structures is linked to the deformations of the plate, which may be considerable due to the large size of the main surface accommodating the mirror in relation to the thickness. Deformations may be caused by residual stresses resulting from the manufacturing process and by environmental factors, such as temperature changes, and result in direction errors of the reflected light beams and, ultimately, in distortions of the projected images.

According to an invention proposed in United States Patent Publication No. 2020/0192199 (corresponding to published European Patent Application No. EP 3,666,727), the plate is provided with a net of reinforcement ribs on the face opposite to the face accommodating the mirror. The ribs stiffen the structure and achieve the effect of reducing the overall deformation of the plate by counteracting residual stresses and internal strains of the material. The projected image is overall improved.

However, locally, the ribs, whose effect, on the other hand, is not modulable, may cause significant concentrations of strains and deformations, although less pronounced with respect to the case of a plate without reinforcements. Projected images may still contain local artifacts and distortions which it would be preferable to avoid.

There is accordingly a need in the art to provide a MEMS mirror device that allows the described limitations of the prior art to be overcome or at least mitigated.

SUMMARY

In an embodiment, a microelectromechanical systems (MEMS) mirror device includes: a supporting frame comprised of semiconductor material; a plate comprised of semiconductor material, the plate connected to the supporting frame so as to be orientable around at least one rotation axis; a reflective layer on a first region of the plate; and a piezoelectric actuation structure extending on a second region of the plate adjacent to the reflective layer and configured to apply forces that modify a curvature of the plate.

The piezoelectric actuation structure may include a piezoelectric compensation actuator extending on the second region of the plate around at least one portion of the reflective layer.

The piezoelectric compensation actuator may have an annular shape and extend seamlessly around the reflective layer.

The piezoelectric compensation actuator may include a plurality of actuator strips of piezoelectric material arranged around the reflective layer.

The piezoelectric compensation actuator may have an annular shape and extend seamlessly around the reflective layer, and the piezoelectric actuation structure may include a plurality of piezoelectric compensation actuators, extending on the second region of the plate and operable independently of each other.

The piezoelectric actuation structure may include a plurality of piezoelectric compensation actuators, extending on the second region of the plate and operable independently of each other.

The piezoelectric compensation actuators may extend concentrically on the second region of the plate.

The piezoelectric compensation actuators may extend concentrically on the second region of the plate, and a first piezoelectric compensation actuator of the plurality of piezoelectric compensation actuators may include first actuator strips of piezoelectric material arranged around the reflective layer.

A first piezoelectric compensation actuator of the plurality of piezoelectric compensation actuators may include first actuator strips of piezoelectric material arranged around the reflective layer.

The first actuator strips may be operable independently of each other.

A second piezoelectric compensation actuator of the plurality of piezoelectric compensation actuators may include second actuator strips of piezoelectric material arranged around the reflective layer.

The second actuator strips may be operable independently of each other.

The first actuator strips may be operable independently of each other, and a second piezoelectric compensation actuator of the plurality of piezoelectric compensation actuators may include second actuator strips of piezoelectric material arranged around the reflective layer.

The plate may be connected to the supporting frame through connection elastic elements configured to allow the rotation of the plate around the at least one rotation axis. The piezoelectric actuation structure may be electrically coupled to contact pads placed on the supporting frame through connection lines. The connection lines may include respective semiconductor portions extending on the connection elastic elements.

Piezoelectric motion actuators may be connected to the supporting frame and the plate, and may be configured to orient the plate around the at least one rotation axis.

In an embodiment, a portable electronic apparatus includes: a picoprojector with a control unit, a micromechanical device controlled by the control unit, and a light source controlled by the control unit to generate a light beam on the basis of an image to be generated, the light source being oriented toward the micromechanical device such that the light beam impinges upon the micromechanical device. The micromechanical device may be as described above.

An interface may be for coupling the picoprojector to a portable electronic apparatus.

A system processor may be coupled to the picoprojector to provide data about the image to be generated to the picoprojector.

BRIEF DESCRIPTION OF THE DRAWINGS

For a better understanding, embodiments thereof are now described, purely by way of non-limiting example, with reference to the attached drawings, wherein:

FIG. 1 is a simplified top plan view of a microelectromechanical mirror device in accordance with an embodiment disclosed herein;

FIG. 2 is a front view of the microelectromechanical mirror device of FIG. 1, cut along line II-II of FIG. 1;

DETAILED DESCRIPTION

Figure 3:
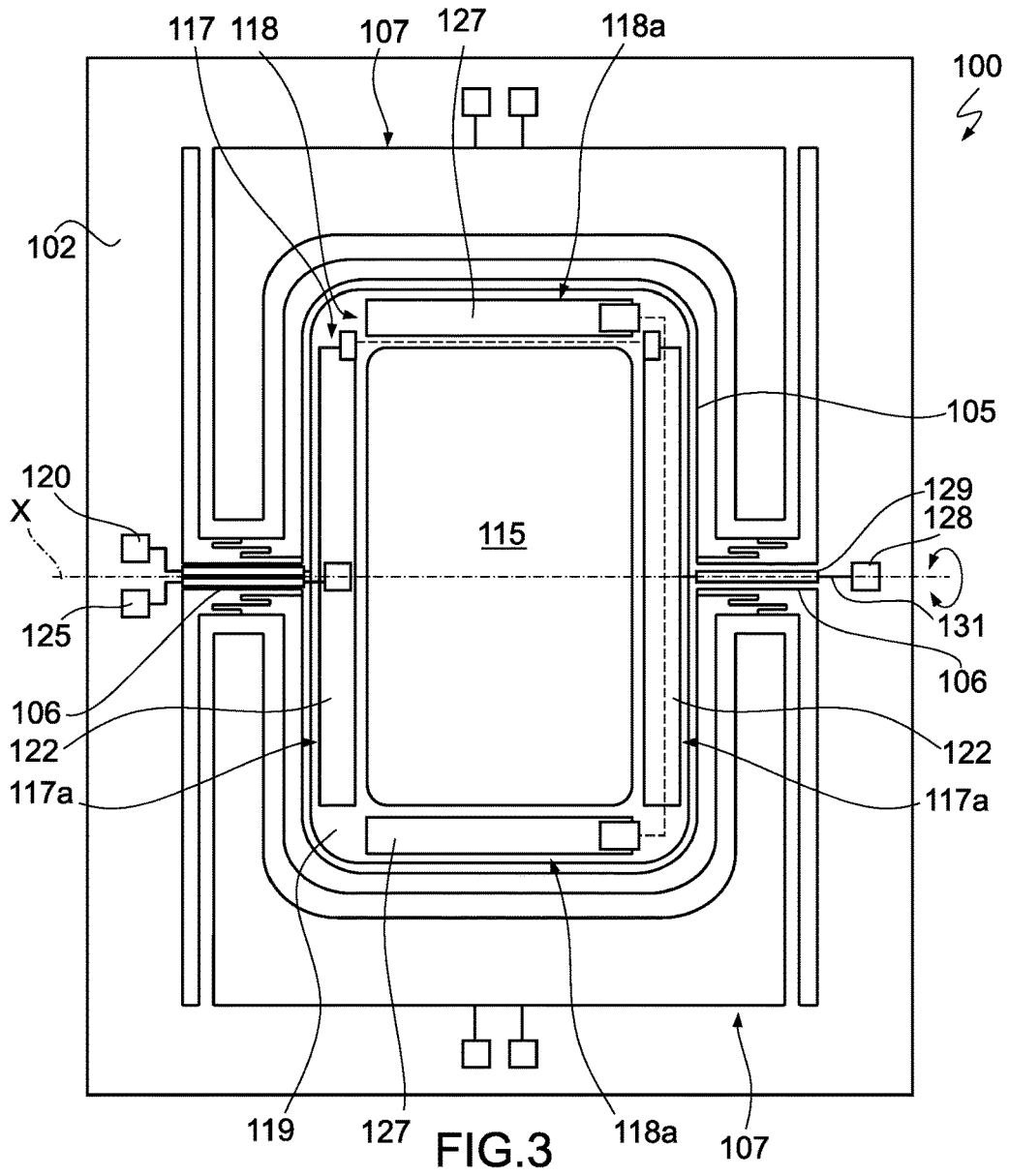
FIG. 3 is a simplified top plan view of a microelectromechanical mirror device in accordance with a different embodiment disclosed herein.

With reference to FIGS. 1 and 2, a microelectromechanical mirror device based on MEMS technology and made in accordance with an embodiment disclosed herein is indicated as a whole with reference numeral 1. In the illustrated non-limiting example, the microelectromechanical mirror device 1 is of a monoaxial type and is formed in a die of semiconductor material, in particular silicon.

The microelectromechanical mirror device 1 comprises a supporting frame 2, which delimits a cavity 3, and a plate 5. The plate 5 partially closes the cavity 3 and is connected to the supporting frame 2 through torsional elastic elements 6, so as to be orientable around a rotation axis X which is also a median axis of the plate 5.

The microelectromechanical mirror device 1 also comprises motion actuator assemblies 7 configured to orient the plate 5 around the rotation axis X in a controlled manner. In detail, in one embodiment each motion actuator assembly 7 comprises a C-shaped cantilever 8, which has a dorsal side connected to the supporting frame 2 and substantially surrounds a respective half of the plate 5, and a piezoelectric motion actuator 10, arranged on the cantilever 8 and also being C-shaped. The motion actuator assemblies 7 are opposite with respect to the rotation axis X. The ends of the cantilevers 8 are connected to the plate 5 in proximity to the rotation axis X through command elastic elements 11. In response to a bias voltage applied through contact pads 12a, 12b (one for each electrode), the piezoelectric motion actuators 10 cause the respective cantilevers 8 to bend and, consequently, the plate 5 to rotate around the rotation axis X.

In the embodiment of FIGS. 1 and 2, the plate 5 has a substantially quadrangular shape with rounded vertices and is symmetrical with respect to the rotation axis X. The shape of the plate 5 is not to be construed as limiting. For example, the plate 5 might be polygonal with a different number of sides, circular or generally elliptical.

A reflective layer 15 of reflective material occupies a central portion of a face of the plate 5 opposite to the cavity 3. The reflective layer 15 may be of a metal, for example gold or aluminum.

A piezoelectric compensation actuator 17 is arranged on the plate 5 and occupies a peripheral region around the reflective layer 15, on the same face. In the embodiment of FIGS. 1 and 2, the piezoelectric compensation actuator 17 has an annular shape and extends seamlessly along the perimeter of the plate 5. In detail, the piezoelectric compensation actuator 17 comprises a stack of layers including a bottom electrode 18, which extends on the plate 5, a piezoelectric region 19, for example of PZT (Lead Zirconate Titanate), and a top electrode 20. Here and below, "bottom electrode" indicates an electrode formed between the surface of the plate and the piezoelectric region, while "top electrode" indicates an electrode formed on the piezoelectric region and opposite to a corresponding bottom electrode. The first electrode 18 and the second electrode 20 are coupled to respective contact pads 20, 21 on the supporting frame 2 to receive respective bias voltages from the outside. The electrical connection is obtained through metal lines 23, 24 on the plate 5 and on the supporting frame 2 and through semiconductor lines 25, 26, for example in doped polycrystalline silicon, on the torsional elastic elements 6. Polycrystalline silicon has a better fatigue resistance with respect to the metals normally used in semiconductor devices, and therefore ensures a longer lifespan on the torsional elastic elements 6 which are subject to continuous twisting movements.

When a bias voltage is applied through the first electrode 18 and the second electrode 20, the piezoelectric region 19 of the piezoelectric compensation actuator 17 expands or contracts to an extent that depends on the sign and value of the bias voltage. Therefore, the piezoelectric compensation actuator 17 tends to deform the plate 5 in a controlled manner and may be used to counteract and compensate for the deformation of the plate 5 caused by the residual stresses of the manufacturing process and by variations in environmental parameters. The compensation action is applied in a peripheral region of the plate 5 and, in any case, outside the area occupied by the reflective layer 15, which thus remains free from concentrated strains and has a regular shape. Furthermore, the force exerted by the piezoelectric compensation actuator 17 is modulable through the value of the applied bias voltage and may effectively compensate both deformations that make the plate 5 concave, and deformations that make it convex. The shape of the piezoelectric compensation actuator 17 may be chosen arbitrarily around the reflective layer 15 so as to adapt the compensation action to the design preferences. For example, families of microelectromechanical mirror devices may have substantially the same tendency to deform as to the plate, since such devices are manufactured through the same process. The shape of the piezoelectric compensation actuator may be optimized on the basis of the expected deformations. The use of the piezoelectric compensation actuator is capable of substantially cancelling the curvature of the plate and therefore of the reflective layer, and in practice allows curvature radii greater than 20 m and planarity errors smaller than 50 nm to be obtained, without discontinuities that might cause artifacts. Furthermore, the piezoelectric compensation actuator 17 may be formed simultaneously with the piezoelectric motion actuators 7 and thus does not utilize additional processing steps.

According to an embodiment illustrated in FIG 3 and 4, a microelectromechanical mirror device 100 comprises a supporting frame 102, a plate 103, and piezoelectric motion actuators 107, substantially as already described with reference to FIGS. 1 and 2. The plate 103 is connected to the supporting frame 102 through torsional elastic elements 106 so as to be orientable around a rotation axis X and is provided with a reflective layer 115 on an external face.

The microelectromechanical mirror device 100 further comprises a first piezoelectric compensation actuator 117 and a second piezoelectric compensation actuator 118 which occupy a peripheral portion of the plate 105 around the reflective layer 115.

The first piezoelectric compensation actuator 117 comprises two first straight actuator strips 117a, which extend perpendicular to the rotation axis X in respective peripheral portions of the plate 105 opposite with respect to the reflective layer 115.

The second piezoelectric compensation actuator 118 comprises two second straight actuator strips 118a, which extend parallel to the rotation axis X in respective peripheral portions of the plate 105 opposite with respect to the reflective layer 115.

Figure 4:
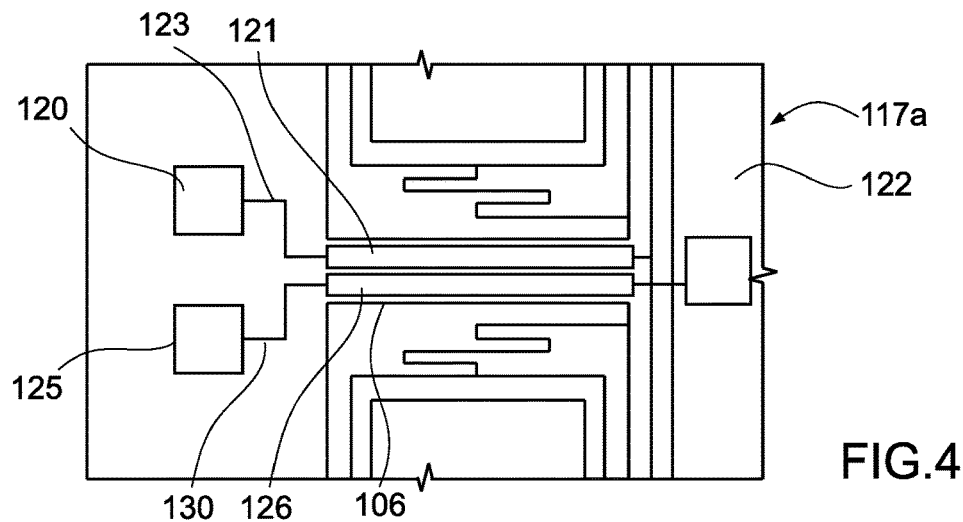
FIG. 4 shows an enlarged detail of the microelectromechanical mirror device of FIG. 3.

In the embodiment of FIGS. 3 and 4, the first piezoelectric compensation actuator 117 and the second piezoelectric compensation actuator 118 have a common bottom electrode 119, which is electrically coupled to a contact pad 120 through metal lines 123 and a semiconductor line 121 running on one of the torsional elastic elements 106. Alternatively, the first piezoelectric compensation actuator 117 and the second piezoelectric compensation actuator 118 may have respective distinct bottom electrodes. The first actuator strips 117a of the first piezoelectric compensation actuator 117 comprise respective first top electrodes 122, connected to a contact pad 125 through metal lines 130, and a semiconductor line 126 adjacent to the semiconductor line 121 and also directly connected to each other (see also the enlargement of FIG. 4). The second actuator strips 118a of the second piezoelectric compensation actuator 118 comprise respective second top electrodes 127 connected to a contact pad 128 through metal lines 131, and a semiconductor line 129 on the other torsional elastic element 106. The connections between the top electrodes 122, 127 may be formed on the surface of the plate 105 or integrated therein.

The use of distinct actuators allows the action of compensating the deformations of plate 105 to be diversified. Furthermore, second order effects may also be corrected.

Figure 5:
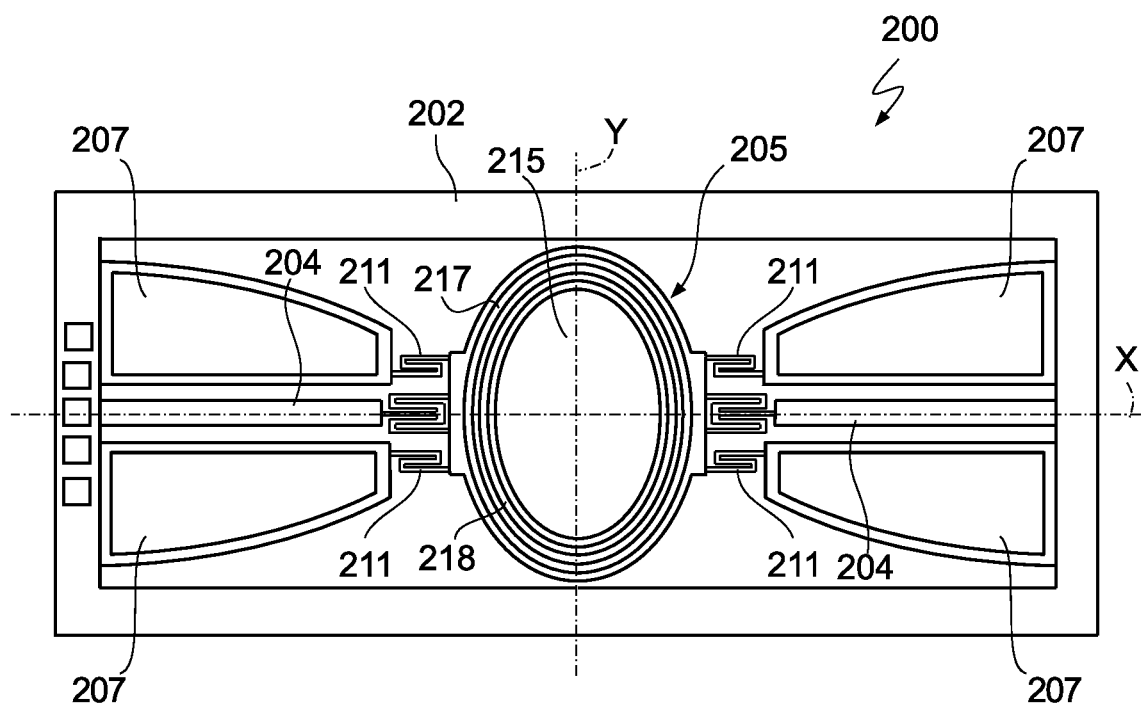
FIG. 5 is a simplified top plan view of a microelectromechanical mirror device in accordance with another embodiment disclosed herein.

With reference to FIG. 5, according to an embodiment, a microelectromechanical mirror device 200 comprises a supporting frame 202 and a plate 205 connected to the supporting frame 202 so as to be orientable around a first X-axis and a second Y-axis perpendicular to each other. More precisely, the plate 205 is connected to supporting elements 204, which extend longitudinally along the first rotation axis X from opposite sides of the supporting frame 202. The microelectromechanical mirror device 200 further comprises four motion actuator assemblies 207 of piezoelectric type, arranged in respective quadrants within the supporting frame 202 and connected to the plate 205 through command elastic elements 211. The motion actuator assemblies 207 are independent of each other and may be operated to orient the plate 205 with respect to the first rotation axis X and to the second rotation axis Y in a controlled manner, as explained for example in the already mentioned United States Patent Publication No. 2020/0192199 (corresponding to published European Patent Application No. EP 3,666,727).

The plate 205 has an elliptical shape and a reflective layer 215 of reflective material, also elliptical in shape, is arranged in a central portion thereof.

The microelectromechanical mirror device 200 further comprises a first piezoelectric compensation actuator 217 and a second piezoelectric compensation actuator 218 which occupy a peripheral portion of the plate 205 around the reflective layer 215. The first piezoelectric compensation actuator 217 and the second piezoelectric compensation actuator 218 have an annular shape and extend seamlessly along all the perimeter of the plate 205. In one embodiment, the first piezoelectric compensation actuator 217 and the second piezoelectric compensation actuator 218 are concentric and are connected with the outside through not-shown conductive lines. In particular, as in the already described embodiments, on the parts subject to continuous movements, in particular on the supporting elements 204, the conductive lines may be formed by semiconductor lines, for example in polycrystalline silicon, which has better fatigue resistance with respect to metals.

Figure 6:
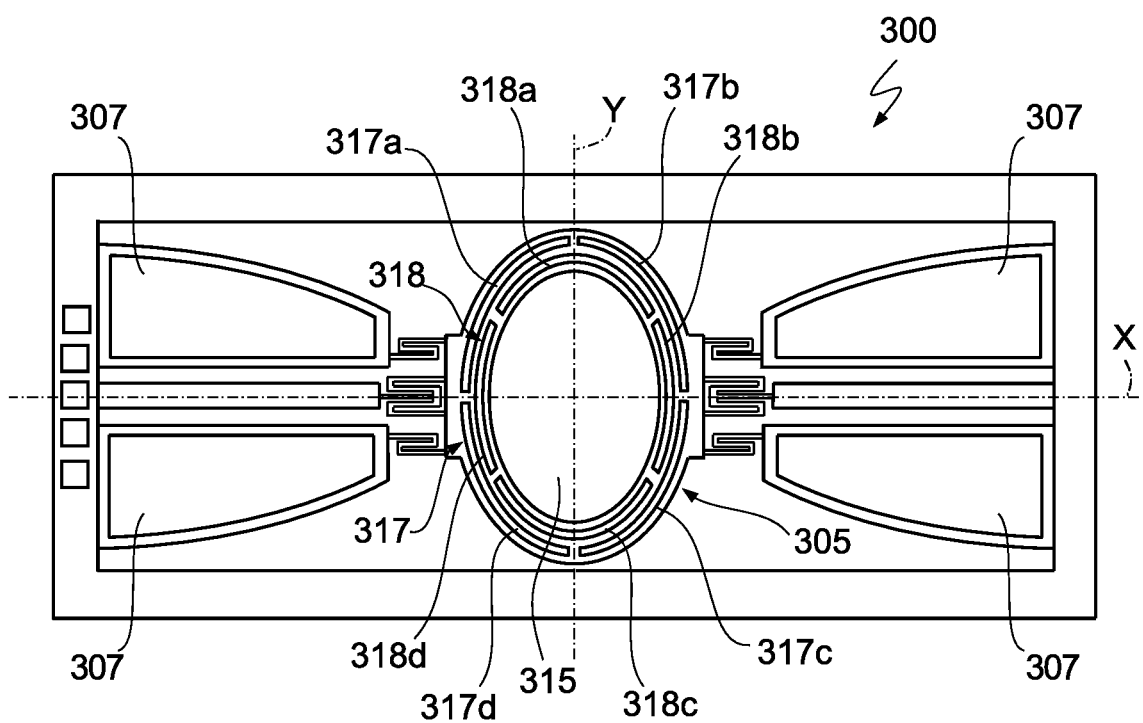
FIG. 6 is a simplified top plan view of a microelectromechanical mirror device in accordance with a further embodiment disclosed herein.

FIG. 6 shows a microelectromechanical mirror device 300 in accordance with a further embodiment. Substantially, as already described for the microelectromechanical mirror device 200 of FIG. 5, the microelectromechanical mirror device 300 comprises: a supporting frame 302; a plate 305, elliptical or circular and connected to the supporting frame 302 so as to be orientable around a first X-axis and a second Y-axis perpendicular to each other; motion actuator assemblies 307 independent of each other and operable to orient the plate 305 with respect to the first rotation axis X and to the second rotation axis Y in a controlled manner; and a reflective layer 315 on a central portion of the plate 305.

The microelectromechanical mirror device 300 further comprises a first piezoelectric compensation actuator 317 and a second piezoelectric compensation actuator 318, which extend along respective concentric elliptical paths on the plate 305 around the reflective layer 315. The first piezoelectric compensation actuator 317 comprises four first actuator strips 317a-317d, which extend along a first elliptical path, each in a respective quadrant of the plate 305, with separation regions in positions corresponding to the first rotation axis X and to the second rotation axis Y. The second piezoelectric compensation actuator 318 comprises four second actuator strips 318a-318d which extend along a second elliptical path. The second actuator strips 318a-318d are continuous to intersections with the first rotation axis X and the second rotation axis Y. Separation regions between the second actuator strips 318a-318d are placed at 45° with respect to the first rotation axis X and to the second rotation axis Y.

The first piezoelectric compensation actuator 317 and the second piezoelectric compensation actuator 318 are operable independently of each other. Furthermore, in one embodiment, the first actuator strips 317a-d of the first piezoelectric compensation actuator 317 are operable independently of each other and, similarly, the second actuator strips 318a-d of the second piezoelectric compensation actuator 318 are operable independently of each other.

Figure 7:
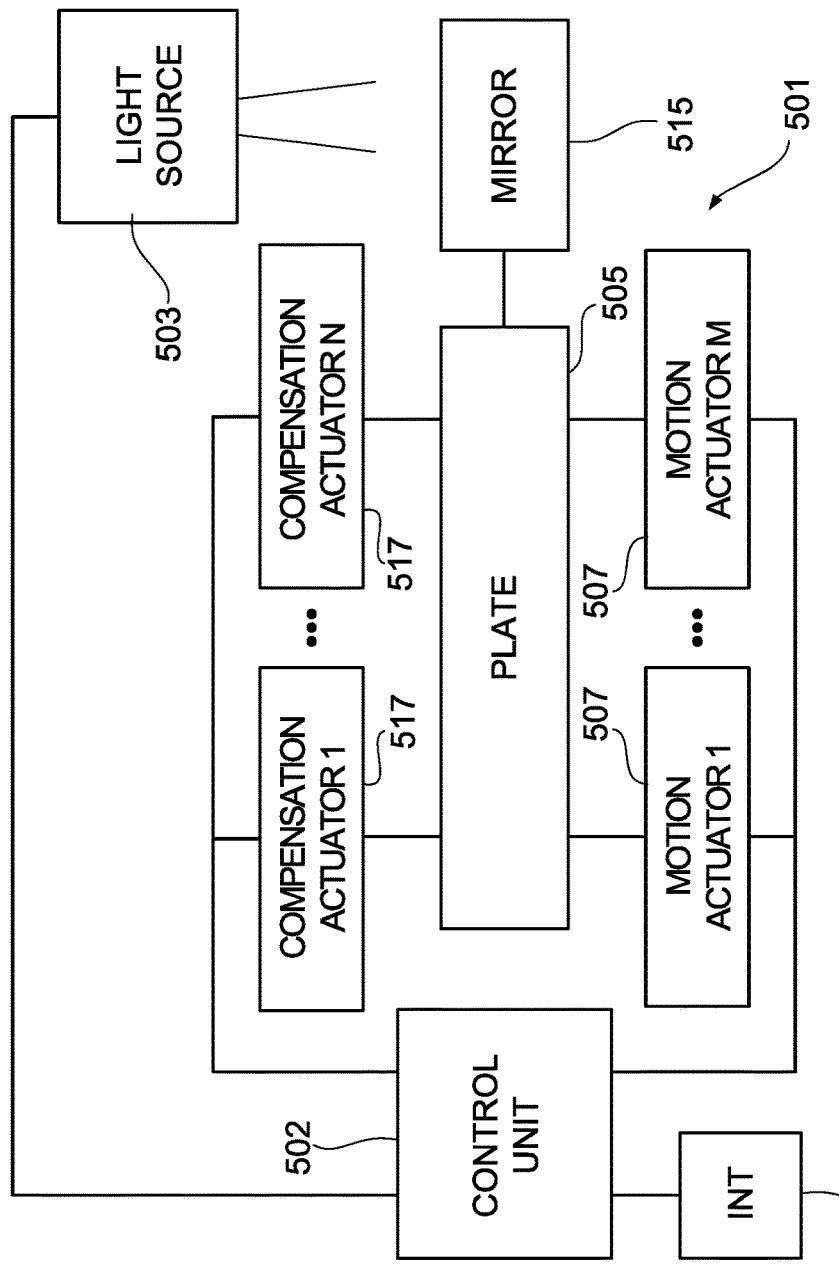
FIG. 7 is a simplified block diagram of a picoprojector device incorporating a microelectromechanical mirror device in accordance with an embodiment disclosed herein.

FIG. 7 illustrates a picoprojector device 500 which comprises a microelectromechanical mirror device 501, a control unit 502, a light source 503, and an interface 504 for the connection to an electronic apparatus, such as a desktop or portable computer, a tablet or a mobile phone.

The microelectromechanical mirror device 501 comprises a semiconductor plate 505 connected to a supporting frame, not shown here, and orientable around a rotation axis (or, in one embodiment, around two independent rotation axes) through a plurality of motion actuators 507. The plate 505 is provided with a reflective layer 515 and with a plurality of piezoelectric compensation actuator 517, substantially of an already-described type.

The control unit 501 controls, on the basis of an image to be projected, a light beam emitted by the light source 503 and the orientation of plate 505 so as to coordinate the projection of a sequence of image points and a two-dimensional scanning procedure of an image area. Furthermore, the control unit 501 applies compensation forces to the plate 505 through the piezoelectric compensation actuators 517 so as to eliminate or reduce the deformations of the plate 505 and improve the planarity.

Figure 8:
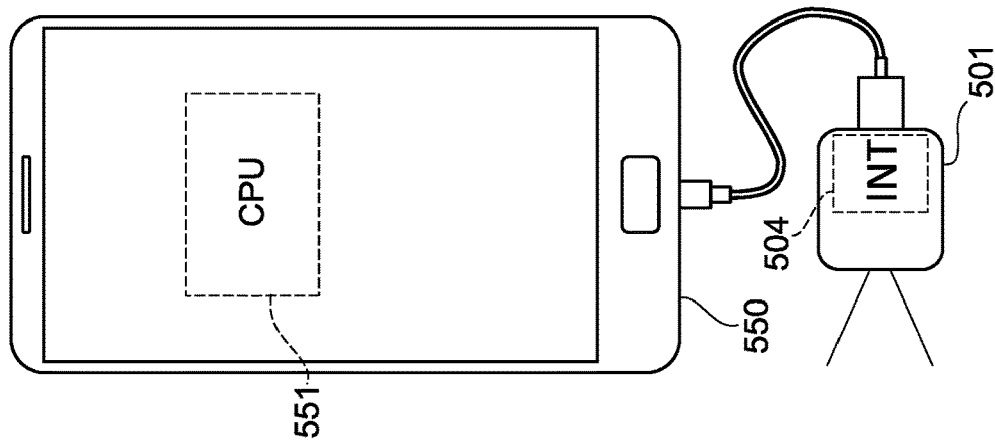
FIG. 8 is a schematic view of a portable electronic apparatus using the picoprojector device of FIG. 7.

FIG. 8 illustrates an electronic apparatus 550, in particular a mobile phone, coupled to the picoprojector device 500 through the interface 504. The electronic apparatus 550 is provided with a system processor 551 which provides the picoprojector device 500 with an image signal, for example a file in a standard image format.

In one embodiment, the picoprojector device may be integrated into the portable apparatus.

Finally, it is clear that modifications and variations may be made to what described and illustrated without thereby departing from the scope of this disclosure.

In particular, it is understood that the number, the shape, the arrangement, and the combinations of the piezoelectric compensation actuators may be arbitrarily selected according to design preferences so as to obtain the desired compensation of the intrinsic curvature of the plate and reduce the planarity errors. By way of non-limiting example, in addition to the embodiments previously described in detail, the piezoelectric compensation actuators may comprise: any number of annular actuators; a single actuator comprising a plurality of independently operable piezoelectric strips; the combination of one or more annular actuators and one or more actuators with a plurality of distinct piezoelectric strips; and a combination of independent linear or curvilinear actuators.

The invention claimed is:

1. A microelectromechanical systems (MEMS) mirror device, comprising:
   a supporting frame comprised of semiconductor material;
   a plate comprised of semiconductor material, the plate connected to the supporting frame so as to be orientable around at least one rotation axis;
   a reflective layer on a first region of the plate; and
   a piezoelectric actuation structure extending on a second region of the plate adjacent to the reflective layer and configured to apply forces that modify a curvature of the plate.

2. The MEMS device according to claim 1, wherein the piezoelectric actuation structure comprises a piezoelectric compensation actuator extending on the second region of the plate around at least one portion of the reflective layer.

3. The MEMS device according to claim 2, wherein the piezoelectric compensation actuator has an annular shape and extends seamlessly around the reflective layer.

4. The MEMS device according to claim 2, wherein the piezoelectric compensation actuator comprises a plurality of actuator strips of piezoelectric material arranged around the reflective layer.

5. The MEMS device according to claim 2, wherein the piezoelectric compensation actuator has an annular shape and extends seamlessly around the reflective layer;
   and wherein the piezoelectric actuation structure comprises a plurality of piezoelectric compensation actuators, extending on the second region of the plate and operable independently of each other.

6. A microelectromechanical systems (MEMS) mirror device, comprising:
   a supporting frame comprised of semiconductor material;
   a plate comprised of semiconductor material, the plate connected to the supporting frame so as to be orientable around at least one rotation axis;
   a reflective layer on a first region of the plate; and
   a piezoelectric actuation structure extending on a second region of the plate adjacent to the reflective layer and configured to apply forces that modify a curvature of the plate, wherein the piezoelectric actuation structure comprises a piezoelectric compensation actuator extending on the second region of the plate around at least one portion of the reflective layer;
   wherein the piezoelectric actuation structure comprises a plurality of piezoelectric compensation actuators, extending on the second region of the plate and operable independently of each other.

7. The MEMS device according to claim 6, wherein the piezoelectric compensation actuators extend concentrically on the second region of the plate.

8. The MEMS device according to claim 6, wherein the piezoelectric compensation actuators extend concentrically on the second region of the plate; and wherein a first piezoelectric compensation actuator of the plurality of piezoelectric compensation actuators comprises first actuator strips of piezoelectric material arranged around the reflective layer.

9. The MEMS device according to claim 6, wherein a first piezoelectric compensation actuator of the plurality of piezoelectric compensation actuators comprises first actuator strips of piezoelectric material arranged around the reflective layer.

10. The MEMS device according to claim 9, wherein the first actuator strips are operable independently of each other.

11. The MEMS device according to claim 9, wherein a second piezoelectric compensation actuator of the plurality of piezoelectric compensation actuators comprises second actuator strips of piezoelectric material arranged around the reflective layer.

12. The MEMS device according to claim 11, wherein the second actuator strips are operable independently of each other.

13. The MEMS device according to claim 9, wherein the first actuator strips are operable independently of each other; and wherein a second piezoelectric compensation actuator of the plurality of piezoelectric compensation actuators comprises second actuator strips of piezoelectric material arranged around the reflective layer.

14. A microelectromechanical systems (MEMS) mirror device, comprising:
   a supporting frame comprised of semiconductor material;
   a plate comprised of semiconductor material, wherein the plate is connected to the supporting frame through connection elastic elements configured to allow the rotation of the plate around the at least one rotation axis;
   a piezoelectric actuation structure extending on a second region of the plate adjacent to the reflective layer and configured to apply forces that modify a curvature of the plate, the piezoelectric actuation structure being electrically coupled to contact pads placed on the supporting frame through connection lines; and
   the connection lines comprising respective semiconductor portions extending on the connection elastic elements.

15. A microelectromechanical systems (MEMS) mirror device, comprising:
   a supporting frame comprised of semiconductor material;
   a plate comprised of semiconductor material, the plate connected to the supporting frame so as to be orientable around at least one rotation axis;
   a reflective layer on a first region of the plate;
   a piezoelectric actuation structure extending on a second region of the plate adjacent to the reflective layer and configured to apply forces that modify a curvature of the plate; and
   piezoelectric motion actuators connected to the supporting frame and the plate, and configured to orient the plate around the at least one rotation axis.

16. A portable electronic apparatus, comprising:
   a picoprojector comprising:
      a control unit;
      a micromechanical device controlled by the control unit; and
      a light source controlled by the control unit to generate a light beam on the basis of an image to be generated, the light source being oriented toward the micromechanical device such that the light beam impinges upon the micromechanical device;
   wherein the micromechanical device comprises:
      a supporting frame comprised of semiconductor material;
      a plate comprised of semiconductor material, the plate connected to the supporting frame so as to be orientable around at least one rotation axis;
      a reflective layer on a first region of the plate; and
      a piezoelectric actuation structure extending on a second region of the plate adjacent to the reflective layer and configured to apply forces that modify a curvature of the plate.

17. The portable electronic apparatus according to claim 16, further comprising an interface for coupling the picoprojector to a portable electronic apparatus.

18. The portable electronic apparatus according to claim 16, further comprising a system processor coupled to the picoprojector to provide data about the image to be generated to the picoprojector.

19. The portable electronic apparatus according to claim 16, wherein the piezoelectric actuation structure comprises a piezoelectric compensation actuator extending on the second region of the plate around at least one portion of the reflective layer.

20. The portable electronic apparatus according to claim 19, wherein the piezoelectric compensation actuator has an annular shape and extends seamlessly around the reflective layer.

21. The portable electronic apparatus according to claim 19, wherein the piezoelectric compensation actuator comprises a plurality of actuator strips of piezoelectric material arranged around the reflective layer.

22. The portable electronic apparatus according to claim 19, wherein the piezoelectric compensation actuator has an annular shape and extends seamlessly around the reflective layer; and wherein the piezoelectric actuation structure comprises a plurality of piezoelectric compensation actuators, extending on the second region of the plate and operable independently of each other.

23. A portable electronic apparatus, comprising:
   a picoprojector comprising:
      a control unit;
      a micromechanical device controlled by the control unit; and
      a light source controlled by the control unit to generate a light beam on the basis of an image to be generated, the light source being oriented toward the micromechanical device such that the light beam impinges upon the micromechanical device;
   wherein the micromechanical device comprises:
      a supporting frame comprised of semiconductor material;
      a plate comprised of semiconductor material, the plate connected to the supporting frame so as to be orientable around at least one rotation axis;
      a reflective layer on a first region of the plate; and
      a piezoelectric actuation structure extending on a second region of the plate adjacent to the reflective layer and configured to apply forces that modify a curvature of the plate;
   wherein the piezoelectric actuation structure comprises a plurality of piezoelectric compensation actuators, extending on the second region of the plate around at least one portion of the reflective layer and operable independently of each other.

24. The portable electronic apparatus according to claim 23, wherein the piezoelectric compensation actuators extend concentrically on the second region of the plate.

25. The portable electronic apparatus according to claim 23, wherein the piezoelectric compensation actuators extend concentrically on the second region of the plate; and wherein a first piezoelectric compensation actuator of the plurality of piezoelectric compensation actuators comprises first actuator strips of piezoelectric material arranged around the reflective layer.

26. The portable electronic apparatus according to claim 23, wherein a first piezoelectric compensation actuator of the plurality of piezoelectric compensation actuators comprises first actuator strips of piezoelectric material arranged around the reflective layer.

27. The portable electronic apparatus according to claim 26, wherein the first actuator strips are operable independently of each other.

28. The portable electronic apparatus according to claim 26, wherein a second piezoelectric compensation actuator of the plurality of piezoelectric compensation actuators comprises second actuator strips of piezoelectric material arranged around the reflective layer.

29. The portable electronic apparatus according to claim 28, wherein the second actuator strips are operable independently of each other.

30. The portable electronic apparatus according to claim 26, wherein the first actuator strips are operable independently of each other; and wherein a second piezoelectric compensation actuator of the plurality of piezoelectric compensation actuators comprises second actuator strips of piezoelectric material arranged around the reflective layer.

31. A portable electronic apparatus, comprising:
a picoprojector comprising:
    a control unit;
    a micromechanical device controlled by the control unit; and
    a light source controlled by the control unit to generate a light beam on the basis of an image to be generated, the light source being oriented toward the micromechanical device such that the light beam impinges upon the micromechanical device;
wherein the micromechanical device comprises:
    a supporting frame comprised of semiconductor material;
    a plate comprised of semiconductor material, wherein the plate is connected to the supporting frame through connection elastic elements configured to allow the rotation of the plate around the at least one rotation axis; the plate connected to the supporting frame through connection elastic elements configured to allow the rotation of the plate around at least one rotation axis;
    a reflective layer on a first region of the plate; and
    a piezoelectric actuation structure extending on a second region of the plate adjacent to the reflective layer and configured to apply forces that modify a curvature of the plate, the piezoelectric actuation structure being electrically coupled to contact pads placed on the supporting frame through connection lines;
    the connection lines comprising respective semiconductor portions extending on the connection elastic elements.

32. The portable electronic apparatus according to claim 16, further comprising piezoelectric motion actuators connected to the supporting frame and the plate, and configured to orient the plate around the at least one rotation axis.

33. The MEMS device according to claim 15, wherein the piezoelectric actuation structure comprises a piezoelectric compensation actuator extending on the second region of the plate around at least one portion of the reflective layer.

34. The MEMS device according to claim 33, wherein the piezoelectric compensation actuator has an annular shape and extends seamlessly around the reflective layer.

35. The MEMS device according to claim 33, wherein the piezoelectric compensation actuator comprises a plurality of actuator strips of piezoelectric material arranged around the reflective layer.

36. The MEMS device according to claim 33, wherein the piezoelectric compensation actuator has an annular shape and extends seamlessly around the reflective layer;
and wherein the piezoelectric actuation structure comprises a plurality of piezoelectric compensation actuators, extending on the second region of the plate and operable independently of each other.

37. The portable electronic apparatus according to claim 31, further comprising an interface for coupling the picoprojector to a portable electronic apparatus.

38. The portable electronic apparatus according to claim 31, further comprising a system processor coupled to the picoprojector to provide data about the image to be generated to the picoprojector.

* * * * *